United States Patent
Mentovich et al.

(10) Patent No.: US 10,522,977 B1
(45) Date of Patent: Dec. 31, 2019

(54) DUAL BAND WAVELENGTH DIVISION MULTIPLEXING (WDM) LINK FOR VERTICAL CAVITY SURFACE EMITTING LASERS (VCSELS)

(71) Applicant: Mellanox Technologies, Ltd., Yokneam (IL)

(72) Inventors: Elad Mentovich, Tel Aviv (IL); Itshak Kalifa, Ramat Gan (IL); Sylvie Rockman, Zichron Yaakov (IL); Eyal Waldman, Tel Aviv (IL); Alon Webman, Tel Aviv (IL); Isabelle Cestier, Yokneam (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 16/179,244

(22) Filed: Nov. 2, 2018

(51) Int. Cl.
| | |
|---|---|
| H01S 5/42 | (2006.01) |
| H01S 5/022 | (2006.01) |
| H04J 14/02 | (2006.01) |
| H04B 10/25 | (2013.01) |
| H04B 10/50 | (2013.01) |
| G02B 6/43 | (2006.01) |
| G02B 6/28 | (2006.01) |
| H04B 10/40 | (2013.01) |

(52) U.S. Cl.
CPC ............... *H01S 5/423* (2013.01); *G02B 6/43* (2013.01); *H01S 5/02248* (2013.01); *H04B 10/25* (2013.01); *H04B 10/503* (2013.01); *H04J 14/02* (2013.01); *G02B 6/28* (2013.01); *H04B 10/40* (2013.01)

(58) Field of Classification Search
CPC ....... H01S 5/423; H01S 5/02248; G02B 6/43; H04B 10/25; H04B 10/503; H04B 10/2575; H04B 10/13; H04B 10/079; H04B 10/2507; H04B 10/50; H04J 14/02
USPC .......................................................... 398/79
See application file for complete search history.

(56) References Cited

U.S. PATENT DOCUMENTS

| | | | |
|---|---|---|---|
| 6,419,404 B1* | 7/2002 | Deri ..................... | G02B 6/4202 385/39 |
| 6,507,595 B1* | 1/2003 | Kapon ................ | H01S 5/18386 257/81 |
| 6,868,236 B2* | 3/2005 | Wiltsey ............... | G02B 6/2804 398/118 |
| 7,412,170 B1* | 8/2008 | Louderback ........... | H01S 5/423 398/158 |
| 9,268,093 B2* | 2/2016 | Bickham .................. | G02B 6/26 |
| 10,075,257 B2* | 9/2018 | Chowdhury ............ | H04J 14/04 |
| 10,120,149 B1* | 11/2018 | Mathai ................... | G02B 6/425 |
| 10,126,882 B2* | 11/2018 | Wassvik ................. | G06F 3/042 |

(Continued)

*Primary Examiner* — Abbas H Alagheband
(74) *Attorney, Agent, or Firm* — Alston & Bird LLP (57) ABSTRACT

An electro-optical link is provided. In an example embodiment, the electro-optical link includes a number of vertical cavity surface emitting lasers (VCSELs); one or more drivers that operate the VCSELs such that each of the VCSELs selectively emits an optical signal; one or more multiplexers that multiplex a number of optical signals into an optical fiber, each optical signal emitted by one of the VCSELs; and one or more optical fibers. At least two optical signals are multiplexed into each optical fiber of the one or more optical fibers. In some example configurations eight or sixteen optical signals are multiplexed into one optical fiber.

19 Claims, 3 Drawing Sheets

(56) References Cited

U.S. PATENT DOCUMENTS

| | | | | |
|---|---|---|---|---|
| 2002/0090172 A1* | 7/2002 | Okazaki | ............... | G02B 6/4204 |
| | | | | 385/27 |
| 2002/0163688 A1* | 11/2002 | Zhu | .................... | H04B 10/2581 |
| | | | | 398/144 |
| 2004/0042736 A1* | 3/2004 | Capewell | ........... | G02B 6/29367 |
| | | | | 385/89 |
| 2004/0120717 A1* | 6/2004 | Clark | .................... | H04B 10/11 |
| | | | | 398/118 |
| 2004/0223881 A1* | 11/2004 | Cunningham | ......... | G01N 21/45 |
| | | | | 422/82.05 |
| 2005/0084268 A1* | 4/2005 | Weigert | ............... | G02B 6/4246 |
| | | | | 398/135 |
| 2008/0069570 A1* | 3/2008 | Dallesasse | ............. | H04B 10/40 |
| | | | | 398/139 |
| 2008/0107422 A1* | 5/2008 | Cole | ....................... | H03M 9/00 |
| | | | | 398/135 |
| 2013/0071105 A1* | 3/2013 | Chang | ................. | G01S 13/9303 |
| | | | | 398/25 |
| 2013/0308951 A1* | 11/2013 | Blumenthal | ............ | H04J 14/02 |
| | | | | 398/83 |
| 2016/0041332 A1* | 2/2016 | Pimpinella | ............ | G02B 6/0288 |
| | | | | 385/124 |
| 2016/0191161 A1* | 6/2016 | Zhang | .................. | H04B 10/503 |
| | | | | 398/194 |
| 2017/0288770 A1* | 10/2017 | Mentovich | ......... | H04B 10/0795 |
| 2019/0107389 A1* | 4/2019 | Ahmed | ............. | G01B 11/2513 |

* cited by examiner

FIG. 1

FIG. 4 ents relate to the field of optical multiplexing. For example, various embodiments relate to wavelength division multiplexing (WDM) for providing up to sixteen channels via a single optical fiber.

DUAL BAND WAVELENGTH DIVISION MULTIPLEXING (WDM) LINK FOR VERTICAL CAVITY SURFACE EMITTING LASERS (VCSELS)

TECHNICAL FIELD

Various embodiments relate to the field of optical multiplexing. For example, various embodiments relate to wavelength division multiplexing (WDM) for providing up to sixteen channels via a single optical fiber.

BACKGROUND

The use of fiber optic cable for data transmission has provided several advantages over the use of copper cable. For example, optical fiber offers very high bandwidth, as well as the ability to accommodate increases in bandwidth (e.g., when data traffic spikes). Optical fiber also provides good resistance to electromagnetic interference and is considered to be a very secure transmission medium.

The demand for communication cables that support higher bandwidth per cross-section, however, continues to rise. Moreover, fiber optic datacenters still face challenges when it comes to the rising costs involved with the installation and ongoing support of their cables and equipment.

BRIEF SUMMARY

Various embodiments provide improved electro-optical communication systems. In an example embodiment, the electro-optical system is an electro-optical link. In various embodiments, an electro-optical system comprises one or more electro-optic transmitter modules in communication with one or more electro-optic receiver modules via one or more optical fibers. In various embodiments, the electro-optical system comprises one or more electro-optic transceiver modules and/or transmitter-receiver modules in communication with one or more other electro-optic transceiver modules and/or transmitter-receiver modules via one or more optical fibers. In an example embodiment, an electro-optic transmitter, transceiver, and/or transmitter-receiver module is configured to convert electrical signals into optical signals using vertical cavity surface emitting lasers (VCSELs). Similarly, an electro-optic receiver, transceiver, and/or transmitter-receiver module is configured to convert optical signals into electrical signals. Various embodiments allow electro-optical communication systems that provide for the use of one or two optical fibers for providing sixteen channels of one or two direction communication using single mode and/or multi-mode optical fibers between the electro-optic transmitter and electro-optic receiver. For example, various embodiments are configured to multiplex sixteen channels into one optical fiber. In another example, various embodiments are configured to multiplex eight channels into one optical fiber. For example, one or more grids of VCSELs may be used in one or more of three wavelength regimes (e.g., 850 nm, 1100 nm, and 1310 nm) to provide for the multiplexing of eight or sixteen channels into a single optical fiber. In an example embodiment, a grid of VCSELs is a set of VCSELs each configured to operate at a wavelength that is (a) within a particular wavelength regime and (b) different from the other VCSELs in the grid.

In one aspect of the present invention, an electro-optical link is provided. In an example embodiment, the electro-optical link comprises a plurality of vertical cavity surface emitting lasers (VCSELs); one or more drivers configured to operate the plurality of VCSELs such that each of the plurality of VCSELs selectively emits an optical signal; one or more multiplexers configured to multiplex a plurality of optical signals into an optical fiber, each optical signal of the plurality of optical signals emitted by one of the plurality of VCSELs; and one or more optical fibers. At least eight optical signals are multiplexed into each optical fiber of the one or more optical fibers.

BRIEF DESCRIPTION OF THE SEVERAL VIEWS OF THE DRAWING(S)

Having thus described the disclosure in general terms, reference will now be made to the accompanying drawings, which are not necessarily drawn to scale, and wherein:

DETAILED DESCRIPTION OF THE DRAWINGS

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, the term "approximately" refers to tolerances within manufacturing and/or engineering standards.

In datacenters that use conventional single mode fiber (SMF) single channel architecture, the bandwidth per cross-section of the optical fiber is limited to the maximum bandwidth per electro-optical VCSEL-based channel, and the SMF single channel infrastructure supports only one wavelength per channel. With small form-factor pluggables (SFP), which plug into network switches and convert serial electrical signals into serial optical signals, a single electrical port is connected to a single optical port. Alternatively, quad small form-factor pluggables (QSFP) may be used, which connect four electrical ports to four optical ports in each direction (transmitting and receiving) using eight fibers per cable (e.g., four fibers in each direction). This results in higher bandwidth (at a higher infrastructure cost), but lower bandwidth per cable cross-section. As another approach, wavelength division multiplexing (WDM) and coarse wavelength division multiplexing (CWDM) using silicon photonics (SiP) transceivers are expected to be launched; however, the total cost of this solution is high, the reliability is as yet unknown, and the assembly of such components is very complex.

Conventional edge-emitting lasers (EMLs) have been used to generate optical signals at wavelengths according to CWDM; however, EMLs generally require 3.5 W of power to operate, which is higher than the power required for generating optical signals using a VCSEL.

According to embodiments of the invention described herein, a multiple of the maximum bandwidth of a VCSEL can be transmitted through one SMF fiber, depending on the number of different wavelengths used. In particular, embodiments of the invention described herein enable a certain number of electrical ports (e.g., data channels) for a communication cable (regardless of the form-factor) to transmit data via a number of optical fiber channels that is smaller than the number of electrical channels. This is accomplished by using different wavelengths for optical data transmission, such as according to WDM/CWDM, while at the same time using VCSELs to generate the optical signals. As a result, embodiments of the invention should significantly reduce the costs of cables and increase the bandwidth per cross-section that is possible.

Figure 1:
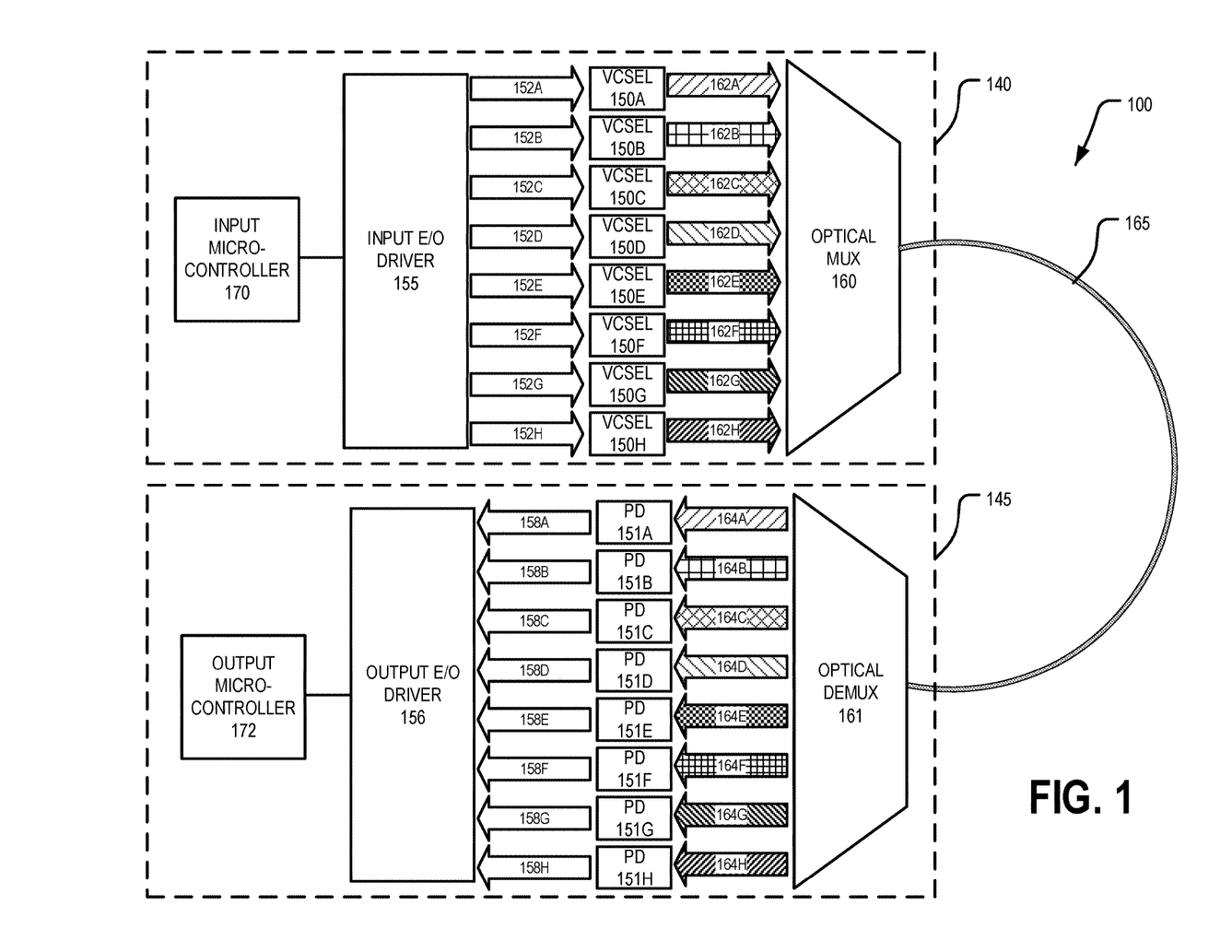
FIG. 1 is a schematic illustration of a portion of an electro-optical link, according to an example embodiment.

Turning to FIG. 1, embodiments of the present invention provide an electro-optic link 100 comprising a transmitter module 140 and a receiver module 145 linked by an optical fiber 165. As used herein, the transmitter module 140 may be a transmitter module, a transceiver module, and/or a transmitter-receiver module. Similarly, as used herein, a receiver module 145 may be a receiver module, transceiver module, and/or a transmitter-receiver module. In an example embodiment, the transmitter module 140 comprises a plurality of VCSELs 150 (e.g., 150A-150H), each VCSEL 150 being configured to convert an electrical signal 152 (e.g., 152A-152H) to a corresponding optical signal for transmission through a fiber optic cable 165. In FIG. 1, for example, the electro-optic transmitter module 140 includes eight VCSELs 150A-150H. In an example embodiment, the electro-optic module 140 may comprise sixteen VCSELs 150. The electro-optic transmitter module 140 may further include at least one input electro-optical driver 155 that includes driving circuitry and is configured to control operation of a corresponding VCSEL 150 (or multiple VCSELs) such that each optical signal has a wavelength that is different from a wavelength of every other optical signal of the plurality of VCSELs. For example, the VCSELs 150 of the transmitter module 140 may comprise a grid of VCSELs. In some cases, a single input electro-optical driver 155 may be provided for controlling the operation of all of the VCSELs 150 in the array, such that in the example of FIG. 1, one input electro-optical driver 155 would control eight VCSELs in a 1—8 configuration. In other cases, however, an input electro-optical driver 155 may be provided for each VCSEL 150, such that in the example shown in FIG. 1, eight input electro-optical drivers 155 would be provided, each input electro-optical driver 155 controlling a particular VCSEL 150 (e.g., an 8—8 configuration). Other configurations (e.g., one input electro-optical driver 155 for each pair of VCSELs 150, etc.) may also be used, as appropriate.

In some embodiments, the input electro-optical driver 155 may be configured to control operation of the VCSELs 150 by selecting a wavelength of the optical signal to be outputted by the corresponding VCSEL(s) according to WDM and/or a predetermined wavelength grid. In various embodiments, a wavelength grid may be provided by n VCSELs 150, wherein n is the number of channels corresponding to the wavelength grid. For example, each VCSEL 150 of a set of VCSELs (e.g., 150A-150H) corresponding to the wavelength grid may be configured to transmit at a different wavelength with respect to the other VCSELs corresponding to the wavelength grid such that each wavelength of the wavelength grid is transmitted by only one of the VCSELs 150 corresponding to the grid. In an example embodiment, the wavelength grid comprises a plurality of equally spaced wavelengths. For example, adjacent wavelengths $\lambda_i$ and $\lambda_{i+1}$ of the wavelength grid may be separated by x (e.g., $\lambda_{i+1} - \lambda_i = X$). For example, in an example embodiment, the wavelength transmitted by VCSEL i of the set of VCSELs corresponding to the wavelength grid is $\lambda_i = \lambda_0 + ix$, where x is the characteristic size of the grid and $\lambda_0$ is a characteristic wavelength of the wavelength grid. In an example embodiment, the wavelength of VCSEL i of the set of VCSELs is $$\lambda_i = \begin{cases} \lambda_0 + (i - n/2) & \text{if } n \text{ is even} \\ \lambda_0 + (i - (n-1)/2) & \text{if } n \text{ is odd} \end{cases},$$

where x is the characteristic size of the grid, n is the number of VCSELs in the set, and $\lambda_0$ is a characteristic wavelength of the set of VCSELs. In various embodiments, the characteristic size x of a grid is the wavelength difference between adjacent wavelengths of the wavelength grid. In an example embodiment, the characteristic wavelength $\lambda_0$ of a wavelength grid indicates an optical band corresponding to the wavelength grid. As should be understood, a variety of techniques for assigning the wavelengths of the wavelength grid having a characteristic size x and a characteristic wavelength $\lambda_0$ may be used in various embodiments.

In various embodiments, a wavelength grid comprises 8 or 16 wavelengths. For example, in various embodiments, n =8 or 16. In various embodiments, the characteristic wavelength $\lambda_0$ of a wavelength grid is approximately 850 nm, 1100 nm, or 1310 nm. In an example embodiment, the characteristic size x of the wavelength grid is approximately 10 nm.

The electro-optic transmitter module 140 may further include an optical multiplexer 160 (also referred to herein as an optical mux) coupled to the plurality of VCSELs 150, as shown in FIG. 1. The optical multiplexer 160 may be configured to receive a plurality of optical signals 162 (e.g., 162A-162H) from the plurality of VCSELs 150 (eight optical signals in the depicted example) and to combine the plurality of optical signals into a single combined optical signal comprising multiple wavelengths. Each VCSEL 150 may be coupled to the optical multiplexer 160 via a coupling (e.g., a prism) that is capable of rotating the optical signal 162 (e.g., the beam of light) generated by the VCSEL 150 by 90° for receipt by the optical multiplexer 160. In various embodiments, the optical multiplexer 160 uses and/or is in communication with one or more serializer/deserializer (SerDes) (e.g., a SerDes for each optical signal 162/each VCSEL 150). In an example embodiment, each SerDes has at least a 50 gigabytes per second bandwidth. The single combined optical signal may then be transmitted through a single optical fiber 165 from the transmitting end of the system to an optical demultiplexer 161 (also referred to as an optical demux herein) in an opto-electronic receiver module 145 at a receiving end of the system 100. In an example embodiment, the optical fiber 165 has a bandwidth of at least 400 gigabytes per second. In an example embodiment, each optical fiber 165 is a OM5 and/or other ultra-wideband optical fiber. The optical demultiplexer 161 may demultiplex (e.g., uncombined) the combined optical signal into its constituent wavelengths 164 (e.g., 164A-164H) for transmission to respective photodetectors (PDs) 151 (e.g., 151A-151H). In various embodiments, the optical demultiplexer 161 uses and/or is in communication with one or more SerDeses (e.g., a SerDes for each element of the combined optical signal and/or each PD 151). In an example embodiment, each SerDes has at least a 50 gigabytes per second bandwidth. The optical demultiplexer 161 may be coupled to the PDs 151 via a 90° coupling, as described above. The PDs 151, in turn, may be configured to convert the respective optical signals 158 (e.g., 158A- 158H) back into electrical signals, such as via communication with an output electro-optical driver 156 (e.g., comprising a transimpedance amplifier (TIA)).

With continued reference to FIG. 1, the electro-optic transmitter module 140 (e.g., at the transmitting end) may further include a microcontroller 170 that is configured to operate and/or control the input electro-optic driver 155 and/or one or more other components of the transmitter module 140 (e.g., temperature monitoring/controlling components, VCSEL wavelength and/or power monitoring/controlling components, and/or the like). In an example embodiment, the electro-optic receiver module 145 (e.g., at the receiving end of the system 100) may further include a microcontroller 175 configured to receive the electrical signals processed and/or provided by the output electro-optic driver 156 and communicate with one or more computing entities.

Figure 2:
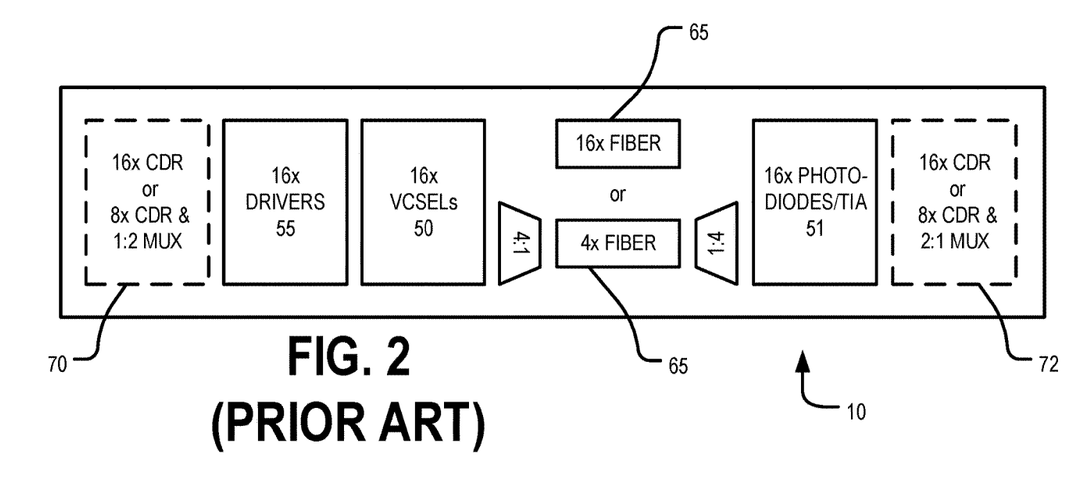
FIG. 2 is a block diagram of a traditional electro-optical link.

FIG. 2 provides an example of a traditional electro-optic link 10 that comprises sixteen clock and data recovery modules 70 or eight clock and data recovery modules 70, each coupled with a one-to-two multiplexer. Each clock and data recovery module signal operates a VCSEL driver 55 that in turn operates a corresponding VCSEL 50. In some configurations, each VCSEL 50 emits a signal via an optical fiber 65 such that to provide sixteen data channels, sixteen optical fibers 65 are required. These data channels may be one or two directional. In some configurations, shortwave WDM is used such that the signal emitted by four VCSELs 50 is multiplexed together to transmit four channels via the same optical fiber. Thus, four optical fibers 65 are required to provide 16 data channels. The optical signal carried by each data channel is converted to an electrical signal by a corresponding photodiode coupled to a transimpedence amplifier 51 and is then provided to a corresponding clock and data recovery module 72. Thus, at best, traditional electro-optic links 10 provide sixteen data channels via four optical fibers. In contrast, various embodiments of the present invention provide electro-optic links 100 that enable eight or sixteen data channels to be transmitted through a single optical fiber such that a sixteen channel electro-optic link 100 requires only one or two optical fibers 165. Thus, various embodiments of the electro-optic link 100 provide an improved and smaller form factor compared to traditional electro-optic links 10.

Figure 3:
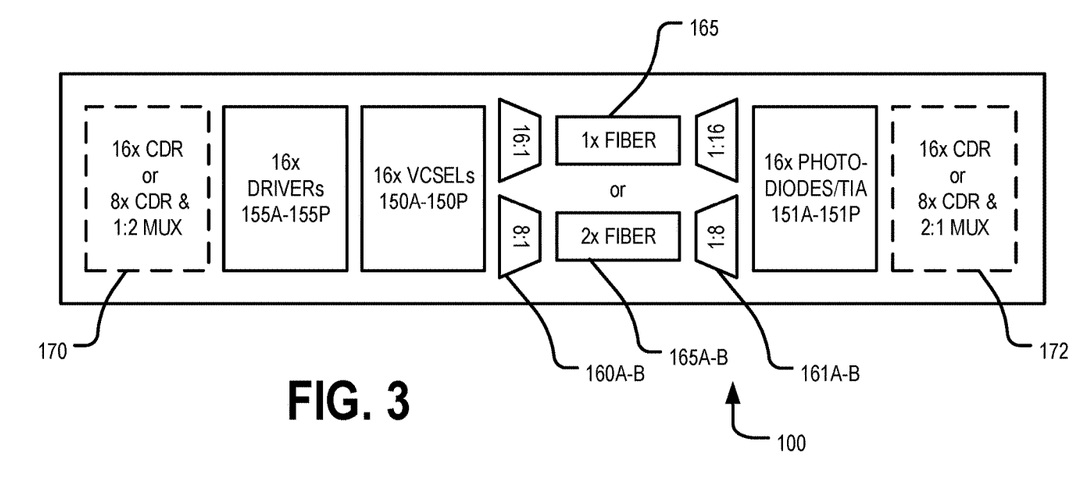
FIG. 3 is a block diagram of some example embodiments of an electro-optical link.

For example, as shown in FIG. 3, an example embodiment of an electro-optical link 100 comprises a micro-controller 170 comprising sixteen clock and data recovery modules or eight clock and data recovery modules, each coupled with a one-to-two multiplexer. Each clock and data recovery module signal operates a VCSEL driver 155 that in turn operates a corresponding VCSEL 150. The signals emitted by the sixteen VCSELs 150 are multiplexed such that sixteen data channels are provided via a single optical fiber 165 or eight data channels are provided via each of two optical fibers 165. Thus, various embodiments of the electro-optical link 100 provides transmission of sixteen data channels via one or two optical fibers 165. The optical signal carried by each data channel is converted to an electrical signal by a corresponding photodiode 151, possibly coupled to a transimpedence amplifier, and is then provided to a corresponding clock and data recovery module, micro-controller 172, computing entity, and/or the like.

Multiplexing Sixteen Channels into One Optical Fiber

In a configuration of the present invention, sixteen data channels are multiplexed (e.g., via multiplexer 160) into one optical fiber 165. The receiving module comprises a corresponding demultiplexer 161 for demultiplexing the 16 data channels form the optical fiber 165. In an example embodiment, the data channels are carried by a first wavelength grid comprising eight distinct wavelengths and a second wavelength grid comprising eight distinct wavelengths. In an example embodiment, the first wavelength grid has a characteristic wavelength $\lambda_0$ of approximately 850 nm. In an example embodiment, the second wavelength grid has a characteristic wavelength $\lambda_0$ of approximately 1100 nm. In an example embodiment, the characteristic size of the first wavelength grid and/or the second wavelength grid is approximately 10 nm. For example, in an example embodiment, the first wavelength grid comprises optical signals at the wavelengths of approximately 815 nm, 825 nm, 835 nm, 845 nm, 855 nm, 865 nm, 875 nm, and 885 nm. In an example embodiment, the second wavelength grid comprises optical signals at the wavelengths of approximately 1065 nm, 1075 nm, 1085 nm, 1095 nm, 1105 nm, 1115 nm, 1125 nm, and 1135 nm.

Multiplexing Sixteen Channels into Two Optical Fibers

In another configuration, eight data channels are multiplexed (e.g., by multiplexer 160A) into a first optical fiber 165A and eight data channels are multiplexed (e.g., by multiplexer 160B) into a second optical fiber 165B. The receiving module 145 comprises a first and second demultiplexer 161A-B for demultiplexing eight data channels from the first and second optical fibers 165A-B, respectively. In an example embodiment, the data channels are carried by a first wavelength grid comprising eight distinct wavelengths and a second wavelength grid comprising eight distinct wavelengths. In an example embodiment, all eight distinct wavelengths of the first wavelength grid are multiplexed into the first optical fiber 165 and all eight distinct wavelengths of the second wavelength grid are multiplexed into the second optical fiber 165. In an example embodiment, one or more of the eight distinct wavelengths of the first wavelength grid are multiplexed into the first optical fiber 165 and the remaining distinct wavelengths of the first wavelength grid are multiplexed into the second optical fiber. Similarly, in an example embodiment, one or more of the eight distinct wavelengths of the second wavelength grid are multiplexed into the first optical fiber 165 and the remaining distinct wavelengths of the second wavelength grid are multiplexed into the second optical fiber. For example, four distinct wavelengths of the first wavelength grid and four distinct wavelengths of the second wavelength grid may be multiplexed into the first optical fiber 165 and the other four distinct wavelengths of the first wavelength grid and the other four distinct wavelengths of the second wavelength grid may be multiplexed into the second optical fiber 165. In an example embodiment, the first wavelength grid has a characteristic wavelength $\lambda_0$ of approximately 1100 nm. In an example embodiment, the second wavelength grid has a characteristic wavelength $\lambda_0$ of approximately 1310 nm. In an example embodiment, the characteristic size of the first wavelength grid and/or the second wavelength grid is approximately 10 nm. For example, in an example embodiment, the first wavelength grid comprises optical signals at the wavelengths of approximately 1065 nm, 1075 nm, 1085 nm, 1095 nm, 1105 nm, 1115 nm, 1125 nm, and 1135 nm. In an example embodiment, the second wavelength grid comprises optical signals at the wavelengths of approximately 1275 nm, 1285 nm, 1295 nm, 1305 nm, 1315 nm, 1325 nm, 1335 nm, and 1355 nm.

In an example embodiment, four wavelength grids each comprising four distinct wavelengths may be used. For example, the channels provided by a first wavelength grid and a second wavelength grid may be multiplexed together and communicated via the first optical fiber 165 and the channels provided by a third wavelength grid and a fourth wavelength grid may be multiplexed together and communicated via the second optical fiber 165. The first and third wavelength grids may each comprise four distinct wavelengths having a characteristic wavelength of $\lambda_0$ of approximately 1100 nm and the second and fourth wavelength grids may each comprise four distinct wavelengths having a characteristic wavelength $\lambda_0$ of approximately 1310 nm. In an example embodiment, the characteristic size of the first, second, third, and/or fourth wavelength grid is approximately 10 nm, 20 nm, and/or the like.

Various embodiments may allow for massive multiplexing around a single mode. In an example embodiment, the first optical fiber may be a single mode fiber and the second optical fiber may be a multi-mode fiber. In an example embodiment, both the first optical fiber and the second optical fiber are single mode fibers. In an example embodiment, both the first optical fiber and the second optical fiber are multi-mode fibers. In an example embodiment, the multiplexing of eight data channels into each of two optical fibers enables the combination of in-rack and out-of-rack signal sources.

Multiplexing Sixteen Channels into Four Optical Fibers

Figure 4:
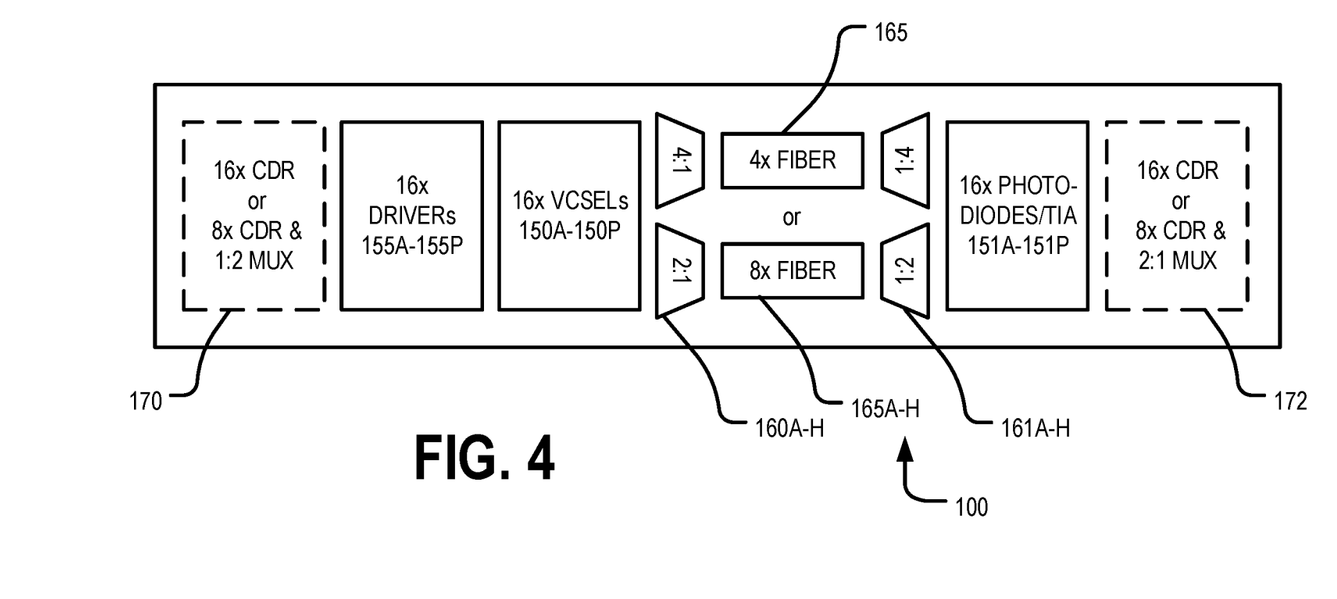
FIG. 4 is a block diagram of some more example embodiments of an electro-optical link.

FIG. 4 illustrates another example configuration in which four data channels are multiplexed into each of four optical fibers 165A-D. In this example configuration, four data channels are multiplexed (e.g., by multiplexer 160A) into a first optical fiber 165A, and four data channels are multiplexed (e.g., by multiplexer 160B) into a second optical fiber 165B, four data channels are multiplexed (e.g., by multiplexer 160C) into a third optical fiber 165C, and four data channels are multiplexed (e.g., by multiplexer 160D) into a fourth optical fiber 165D. The receiver module 145 may comprise four demultiplexers 161A-D for de-multiplexing four channels from the first, second, third, and fourth optical fibers 165A-D, respectively.

In an example embodiment, the data channels are carried by a first wavelength grid comprising eight distinct wavelengths and a second wavelength grid comprising eight distinct wavelengths. Thus, in an example embodiment, each channel of the sixteen channels is encoded by a unique wavelength such that none of the channels have optical carriers of the same wavelength. In an example embodiment, four distinct wavelengths of the first wavelength grid are multiplexed into the first optical fiber 165, four distinct wavelengths of the first wavelength grid are multiplexed into the second optical fiber 165, four distinct wavelengths of the second wavelength grid are multiplexed into the third optical fiber 165, and four distinct wavelengths of the second wavelength grid are multiplexed into the fourth optical fiber 165. In an example embodiment, one or more wavelengths of the first and second wavelength grids are multiplexed into the same optical fiber 165. For example, two distinct wavelengths of the first wavelength grid and two distinct wavelengths of the second wavelength grid may be multiplexed into each of the optical fibers 165. In an example embodiment, the first and/or second wavelength grid has a characteristic wavelength $\lambda_0$ of approximately 1100 nm. In an example embodiment, the first and/or second wavelength grid has a characteristic wavelength $\lambda_0$ of approximately 1310 nm. In an example embodiment, the first and/or second wavelength grid has a characteristic wavelength $\lambda_0$ of approximately 850 nm. In an example embodiment, the characteristic size of the first wavelength grid and/or the second wavelength grid is approximately 10 nm.

In an example embodiment, four wavelength grids each comprising four distinct wavelengths may be used. For example, the channels provided by a first wavelength grid and a second wavelength grid may be multiplexed together and communicated via the first optical fiber 165 and the channels provided by a third wavelength grid and a fourth wavelength grid may be multiplexed together and communicated via the second optical fiber 165. In another example, the channels provided by each wavelength grid may be multiplexed together for transmission. The first and third wavelength grids may each comprise four distinct wavelengths having a characteristic wavelength of $\lambda_0$ of approximately 1100 nm and the second and fourth wavelength grids may each comprise four distinct wavelengths having a characteristic wavelength $\lambda_0$ of approximately 1310 nm. In an example embodiment, each of the first, second, third, and fourth wavelength grids have the same characteristic wavelength (e.g., $\lambda_0$ of approximately 1310 nm, 1100 nm, or 850 nm). In an example embodiment, the characteristic size of the first, second, third, and/or fourth wavelength grid is approximately 10 nm, 20 nm, and/or the like.

In various embodiments, the first, second, third, and/or fourth optical fibers 165A-D may be single mode or multi-mode fibers. In an example embodiment, all of the first, second, third, and fourth optical fibers 165A-D are single mode fibers. In an example embodiment, all of the first, second, third, and fourth optical fibers 165A-D are multi-mode fibers. In an example embodiment, at least one of the first, second, third, and fourth optical fibers 165A-D is a single mode fiber and at least one of the first, second, third, and fourth optical fibers 165A-D is a multi-mode fiber. In various embodiments, the characteristic wavelength and/or characteristic size of the wavelength grids may be selected based on the desired infrastructure of the transmission module 140 and the receiving module 145 (e.g., which optical fibers 165A-D are single mode or multi-mode optical fibers).

Multiplexing Sixteen Channels into Eight Optical Fibers

FIG. 4 illustrates yet another example configuration in which two data channels are multiplexed into each of eight optical fibers 165A-H. In this example configuration, two data channels are multiplexed (e.g., by multiplexer 160A) into a first optical fiber 165A, two data channels are multiplexed (e.g., by multiplexer 160B) into a second optical fiber 165B, two data channels are multiplexed (e.g., by multiplexer 160C) into a third optical fiber 165C, two data channels are multiplexed (e.g., by multiplexer 160D) into a fourth optical fiber 165D, two data channels are multiplexed (e.g., by multiplexer 160E) into a fifth optical fiber 165E, two data channels are multiplexed (e.g., by multiplexer 160F) into a sixth optical fiber 165F, two data channels are multiplexed (e.g., by multiplexer 160G) into a seventh optical fiber 165G, two data channels are multiplexed (e.g., by multiplexer 160H) into a eight optical fiber 165H. The receiver module 145 may comprise eight demultiplexers 161A-H for de-multiplexing two channels from the first through eighth optical fibers 165A-H, respectively. In an example embodiment, the transmission module 140 and the receiving module 145 are configured to couple to the optical fibers 165A-H using lucent connectors (LCs).

In an example embodiment, the data channels are carried by a first wavelength grid comprising eight distinct wavelengths and a second wavelength grid comprising eight distinct wavelengths. Thus, in an example embodiment, each channel of the sixteen channels is encoded by a unique wavelength such that none of the channels have optical carriers of the same wavelength. In an example embodiment, the wavelengths multiplexed into each optical fiber 165 may be from the same or different wavelength grid. For example, the first optical fiber 165A may carry two channels carried by distinct wavelengths from the first wavelength grid. In an example embodiment, the second optical fiber 165B carries two channels carried by distinct wavelengths form the second wavelength grid. In an example embodiment, the third optical fiber 165C carries a channel carried by a wavelength from the first wavelength grid and another channel carried by a wavelength from the second wavelength grid. In an example embodiment, the first and/or second wavelength grid has a characteristic wavelength $\lambda_0$ of approximately 1100 nm. In an example embodiment, the first and/or second wavelength grid has a characteristic wavelength $\lambda_0$ of approximately 1310 nm. In an example embodiment, the first and/or second wavelength grid has a characteristic wavelength $\lambda_0$ of approximately 850 nm. In an example embodiment, the characteristic size of the first wavelength grid and/or the second wavelength grid is approximately 10 nm.

In an example embodiment, four wavelength grids each comprising four distinct wavelengths may be used. For example, a channel provided by a first wavelength grid and a channel provided by a second wavelength grid may be multiplexed together and communicated via the first optical fiber 165A and a channel provided by a third wavelength grid and a channel provided by a fourth wavelength grid may be multiplexed together and communicated via the second optical fiber 165B. In another example, two channels provided by a wavelength grid may be multiplexed together for transmission. The first and third wavelength grids may each comprise four distinct wavelengths having a characteristic wavelength of $\lambda_0$ of approximately 1100 nm and the second and fourth wavelength grids may each comprise four distinct wavelengths having a characteristic wavelength $\lambda_0$ of approximately 1310 nm. In an example embodiment, each of the first, second, third, and fourth wavelength grids have the same characteristic wavelength (e.g., $\lambda_0$ of approximately 1310 nm, 1100 nm, or 850 nm). In an example embodiment, the characteristic size of the first, second, third, and/or fourth wavelength grid is approximately 10 nm, 20 nm, and/or the like.

In various embodiments, the first, second, third, fourth, fifth, sixth, seventh, and/or eighth optical fibers 165A-H may be single mode or multi-mode fibers. In an example embodiment, all of the first through eighth optical fibers 165A-H are single mode fibers. In an example embodiment, all of the first through eighth optical fibers 165A-H are multi-mode fibers. In an example embodiment, at least one of the first through eighth optical fibers 165A-H is a single mode fiber and at least one of the first through eighth optical fibers 165A-H is a multi-mode fiber.

Conclusion

Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation. For example, it is noted that the term "electro-optic" may be used interchangeably with "electro/optical." Moreover, although embodiments of the invention described herein refer to electro-optic transmitter modules with respect to groups of components that cooperatively convert electrical signals to optical signals and likewise refer to opto-electronic receiver modules with respect to groups of components that cooperatively convert optical signals into electrical signals, it is understood in light of this disclosure that in some configurations a module may have components that convert electrical signals to optical signals for transmission in one direction and may also have components that convert optical signals to electrical signals upon receipt of the optical signals in the opposite direction. Accordingly, in such cases, the terms electro-optic and opto-electronic may be used interchangeably to refer to the combined groupings of components.

What is claimed is:

1. An electro-optical link comprising:
   a plurality of vertical cavity surface emitting lasers (VCSELs);
   one or more drivers configured to operate the plurality of VCSELs such that each of the plurality of VCSELs selectively emits an optical signal, each optical signal being of a distinct wavelength;
   one or more multiplexers configured to multiplex a plurality of optical signals into an optical fiber, each optical signal of the plurality of optical signals emitted by one of the plurality of VCSELs; and
   one or more optical fibers, wherein at least two optical signals are multiplexed into each optical fiber of the one or more optical fibers,
   wherein (a) the plurality of VCSELs comprises a first set of VCSELs and a second set of VCSELs, (b) the first set of VCSELs is configured to provide optical signals in a first wavelength grid having a first characteristic wavelength and a first characteristic size and the second set of VCSELs is configured to provide optical signals in a second wavelength grid having a second characteristic wavelength and a second characteristic size, (c) the first characteristic wavelength is different from the second characteristic wavelength, (d) a characteristic wavelength of a wavelength grid indicates a wavelength band corresponding to the wavelength grid, and (e) a characteristic size of the wavelength grid is a wavelength difference between adjacent wavelengths of the wavelength grid.

2. The electro-optical link of claim 1, wherein the characteristic size is approximately 10 nm.

3. The electro-optical link of claim 1, wherein the characteristic wavelength is selected from a group consisting of 850 nm, 1100 nm, and 1310 nm.

4. The electro-optical link of claim 1, wherein each optical signal in the wavelength grid is provided at a wavelength that is distinct from other wavelengths of the wavelength grid.

5. The electro-optical link of claim 1, wherein the plurality of VCSELs consists of sixteen VCSELs and the one or more optical fibers consist of one optical fiber such that sixteen optical signals are multiplexed into the one optical fiber.

6. The electro-optical link of claim 1, wherein (a) the first characteristic wavelength is one of 850 nm, 1100 nm, or 1310 nm, and (b) the second characteristic wavelength is a different one of 850 nm, 1100 nm, or 1310 nm such that the first characteristic wavelength is different from the second characteristic wavelength.

7. The electro-optical link of claim 1, wherein the optical signals of the first wavelength grid and the second wavelength grid are multiplexed into one optical fiber of the one or more optical fibers.

8. The electro-optical link of claim 1, wherein the optical signals of the first wavelength grid are multiplexed into a first optical fiber of the one or more optical fibers and the optical signals of the second wavelength grid are multiplexed into a second optical fiber of the one or more optical fibers.

9. The electro-optical link of claim 6, wherein the characteristic sizes of the first and second wavelength grids are approximately 10 nm.

10. The electro-optical link of claim 1, wherein the one or more optical fibers comprise at least one of (a) a single mode fiber or (b) a multi-mode fiber.

11. The electro-optical link of claim 1, wherein the one or more optical fibers comprises no more than one optical fiber for each set of eight VCSELs of the plurality of VCSELs.

12. The electro-optical link of claim 1 further comprising:
a demultiplexer coupled to each of the one or more optical fibers; and
a photodiode corresponding to each optical signal configured to receive a demultiplexed optical signal and convert the demultiplexed optical signal into a corresponding electrical signal.

13. The electro-optical link of claim 1, wherein the plurality of VCSELs, one or more drivers, and one or more multiplexers are configured to multiplex sixteen data channels into one optical fiber.

14. The electro-optical link of claim 1, wherein the plurality of VCSELs, one or more drivers, and one or more multiplexers are configured to multiplex eight data channels into each of the one or more optical fibers.

15. The electro-optical link of claim 1, wherein at least eight optical signals are multiplexed into each optical fiber of the one or more optical fibers.

16. The electro-optical link of claim 1, wherein sixteen optical signals are multiplexed into one optical fiber.

17. The electro-optical link of claim 16, wherein the one optical fiber is a wideband multi-mode optical fiber.

18. The electro-optical link of claim 1, wherein the plurality of VCSELs comprises a plurality of sets of VCSELs, each set of VCSELs of the plurality of sets of VCSELs configured to provide optical signals in a particular wavelength grid having a particular characteristic wavelength.

19. The electro-optical link of claim 18, wherein the particular characteristic wavelength of each set of VCSELs of the plurality of sets of VCSELs is different from a particular characteristic wavelength of each other set of VCSELs of the plurality of sets of VCSELs.

* * * * *